United States Patent
Hichwa

(10) Patent No.: US 6,210,540 B1
(45) Date of Patent: Apr. 3, 2001

(54) METHOD AND APPARATUS FOR DEPOSITING THIN FILMS ON VERTICAL SURFACES

(75) Inventor: Bryant P. Hichwa, Santa Rosa, CA (US)

(73) Assignee: Optical Coating Laboratory, Inc., Santa Rosa, CA (US)

(*) Notice: Subject to any disclaimer, the term of this patent is extended or adjusted under 35 U.S.C. 154(b) by 0 days.

(21) Appl. No.: 09/518,743

(22) Filed: Mar. 3, 2000

(51) Int. Cl.[7] .................. C23C 14/04; C23C 14/38; C23C 14/00; C23C 14/34
(52) U.S. Cl. .............. 204/192.12; 204/192.12; 204/192.11; 204/298.29; 204/298.11; 204/298.04; 204/192.15; 204/298.23
(58) Field of Search .................. 204/192.12, 192.11, 204/298.28, 298.11, 298.04, 192.15, 298.23

(56) References Cited

U.S. PATENT DOCUMENTS

| | | | |
|---|---|---|---|
| 3,856,654 | * 12/1974 | George | 204/298.11 |
| 3,904,503 | * 9/1975 | Hanfmann | 204/298.11 |
| 4,591,418 | * 5/1986 | Snyder | 204/298.28 |
| 4,851,095 | 7/1989 | Scobey et al. | 204/192.12 |
| 5,415,753 | * 5/1995 | Hurwitt et al. | 204/192.12 |
| 5,618,388 | 4/1997 | Seeser et al. | 204/192.12 |

* cited by examiner

Primary Examiner—Mark F. Huff
Assistant Examiner—Daborah Chacko Davis
(74) Attorney, Agent, or Firm—Scott W. Hewett

(57) ABSTRACT

A mask is placed over a center portion of a deposition source to limit angle of the flux from the source. A substrate or device with a vertical surface (referenced to a major surface of the substrate or device) is rotated past the deposition source to coat the vertical surface with material from the source. In a particular embodiment, the source is a gold sputtering target and a mirror is formed on a vertical surface of a MEMS structure having a depth of about 70–75 microns and a set-back of about 200–250 microns by sputtering about 1000 Angstroms of gold onto the vertical surface.

12 Claims, 3 Drawing Sheets

METHOD AND APPARATUS FOR DEPOSITING THIN FILMS ON VERTICAL SURFACES

CROSS-REFERENCE TO RELATED APPLICATIONS

This patent application is being concurrently filed with U.S. patent application Ser. No. 09/517,650 entitled TAPERED LENSED FIBER OPTICAL SWITCH by Hichwa et al.; U.S. patent application Ser. No. 09/517,649 entitled BI-STABLE MICRO SWITCH by Hichwa et al.; and U.S. patent application Ser. No. 09/517,913 entitled METHOD OF DRIVING A MEMS ACTUATOR by Hichwa et al., the disclosures of which are hereby incorporated by reference for all purposes.

STATEMENT REGARDING FEDERALLY SPONSORED RESEARCH OR DEVELOPMENT

Not applicable.

REFERENCE TO MICROFICHE APPENDIX

Not applicable.

FIELD OF THE INVENTION

The present invention is generally related to thin film deposition techniques, and more particularly to a method and apparatus for depositing a thin film on a surface that is essentially vertical to a major plane of a substrate.

BACKGROUND OF THE INVENTION

Thin film processing is used in many industrial applications, such as semiconductor fabrication, optical component fabrication, and micro-electro-mechanical systems ("MEMS"). In many, if not most, applications, a thin film layer is formed on a major surface of a substrate, such as the polished surface of a silicon wafer or the surface of a glass blank. However, some devices and fabrication process need to deposit a thin film on a surface that is vertical to the major surface of the substrate. For example, a structure of a MEMS device might be formed by deep reactive ion etching ("DRIE"), and it might be desirable to deposit a layer on a vertical surface or surfaces. Unfortunately, most deposition processes are not suited for forming such a layer. In particular, conventional processes tend to build up material proximate to the major surface while not depositing as much material distal from the major surface. This can cause a rough or uneven surface, affecting the performance of the deposited layer.

Thus it is desirable to provide a method and apparatus for forming an even layer of thin film material on a vertical surface of a structure formed on a substrate.

SUMMARY OF THE INVENTION

The present invention provides a method and apparatus for depositing thin film layers on vertical surfaces of structures fabricated or attached to a substrate by masking a central portion of a material source and rotating the workpiece with respect to the material source. In a particular embodiment, the material source is a sputtering target. A mask is placed over a central portion of the sputtering target to limit the material flux from the target to a side lobe or lobes. The aperture between the mask and the edge of the target is chosen according to the distance of the workpiece from the target and depth of the vertical surface, which in a specific embodiment is about 70–75 microns with a set-back of about 200–250 microns from a facing wall of the MEMS structure. The sputtering is done at a low angle of incidence compared with conventional sputtering onto the major surface. The low angle of incidence results in a longer mean free path between the target and the device, thus the sputtering pressure is reduced. In a particular embodiment, the mean free path is increased from about 5–7 cm for sputtering onto a major surface to about 20–30 cm for sputtering onto a vertical surface, and the chamber pressure is reduced from nominally 1–3 mT to about $10^{-4}$T.

BRIEF DESCRIPTION OF THE DRAWINGS

FIG. 2 is a simplified perspective view of a portion of a MEMS device suitable for applying embodiments of the present invention to.

DETAILED DESCRIPTION OF THE INVENTION

I. Introduction

The present invention places a mask over the center portion of a deposition source to limit the material flux from the source to side lobes. A workpiece is rotated with respect to the source to form a uniform layer of material on a vertical surface of the workpiece, the vertical surface lying essentially along a radius from the center of rotation.

II. An Exemplary Apparatus

Figure 1A:
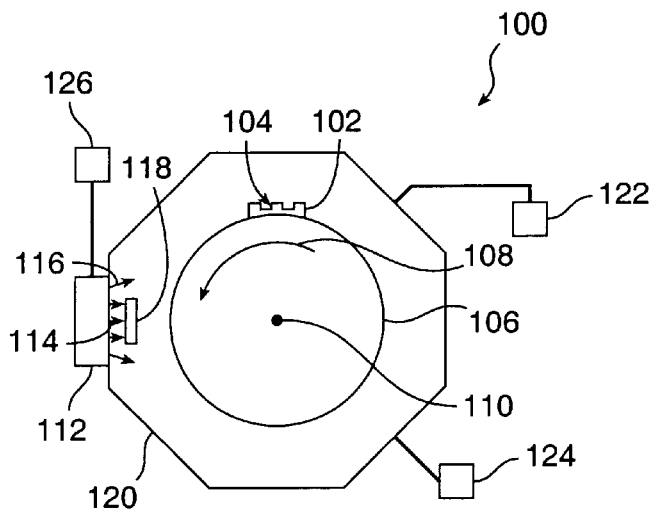
FIG. 1A is a simplified cross section of an apparatus and associated systems according to an embodiment of the present invention.

FIG. 1A is a simplified cross section of an apparatus 100 according to an embodiment of the present invention. A workpiece 102 with a vertical surface 104 is mounted on a drum 106 that rotates (indicated by the arrow 108) about an axis 110 at an exemplary speed of about 100 rpm. The drum has a diameter of about 1.4 meters. A material source 112 provides a flux that includes a center flux 114 and a side flux 116. A mask 118 placed over the center portion of the source blocks the center flux and admits the side flux to the workpiece as it rotates past the source. In other embodiments, a portion of the side flux is also masked to further control the deposition pattern.

The workpiece and source are inside a vacuum chamber 120. A vacuum system 122 is capable of reducing the pressure within the vacuum chamber to a desired pressure. A gas source 124 may also be used to provide a selected atmosphere, such as an inert, reducing, reactive, or oxidizing atmosphere, inside the chamber. An apparatus suitable for modification according to the present invention is a META-MODE™ system available from OPTICAL COATING LABORATORY, INC., of Santa Rosa, Calif. Further details of an apparatus suitable for modification according to an embodiment of the present invention are presented in U.S. Pat. No. 4,851,095 entitled MAGNETRON SPUTTERING APPARATUS AND PROCESS by Scobey et al., issued Jul. 25, 1989, and U.S. Pat. No. 5,618,388 entitled GEOMETRIES AND CONFIGURATIONS FOR MAGNETRON SPUTTERING APPARATUS by Seeser et al., issued Apr. 8, 1997, the disclosures of both of which are herein incorporated by reference for all purposes.

In a particular embodiment, the material source is a sputtering target, such as a gold target with an area of about 125 mm×300–900 mm and direct current ("DC") or radio-frequency ("RF") energy is provided to the material source 112 from a power supply 126.

Alternatively, other types of sources and systems may be used, such as an evaporative or ion beam sputtering source. An evaporative source could be configured as a trough in the horizontal plane, being heated by an electron beam or other heat source. The inclusion of the mask of the present invention allows a greater degree of design freedom when designing the material source because the center flux, which is normally the desired portion of the material flux, is not used. Accordingly, energy sources that would interfere with deposition on the major surface of the substrate can be placed between the material source and the mask.

Figure 1B:
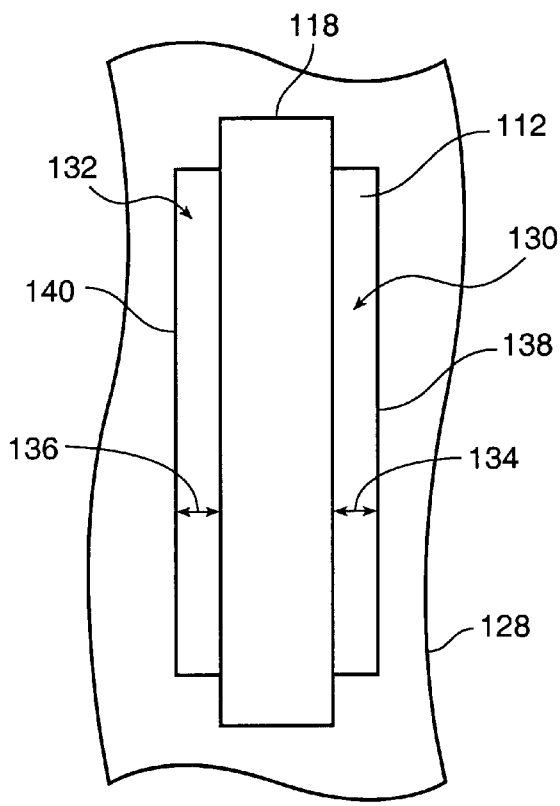
FIG. 1B is a front view of a portion of a vacuum chamber wall and source mask according to an embodiment of the present invention.

FIG. 1B is a simplified front view of the a portion of the vacuum chamber wall 128, the mask 118 and the apertures 130, 132 formed by the gaps 134, 136 between the mask and the long edges 138, 140 of the material source 112. The material source is a sputtering target is about 125 mm wide and the mask is about 75 mm wide, and each gap is about 25 mm wide.

Figure 1C:
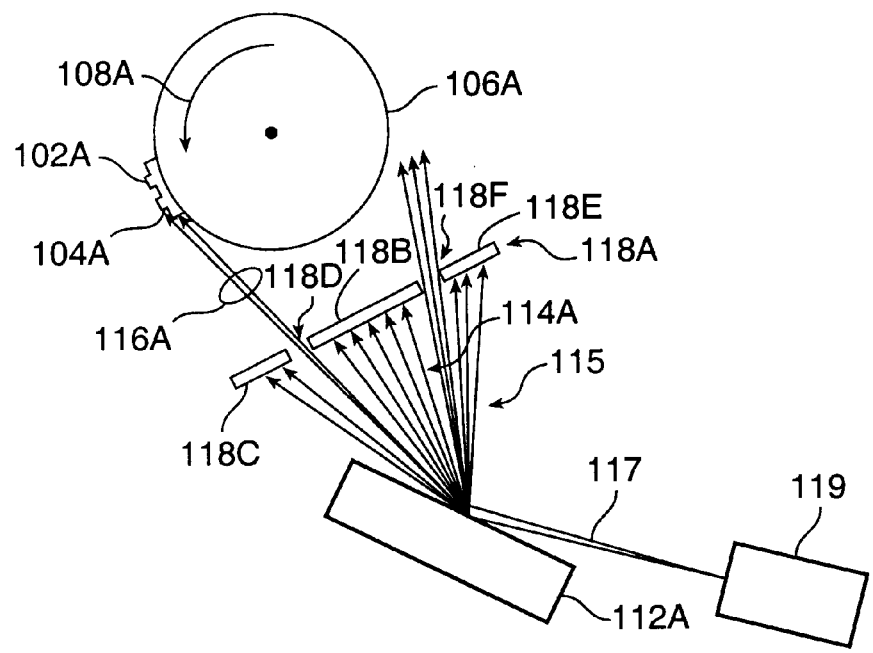
FIG. 1C is a simplified diagram of an ion beam sputtering apparatus configured according to an embodiment of the present invention.

FIG. 1C is a simplified top view of portion of an ion beam sputtering source configured according to an embodiment of the present invention. A drum 106A holding a workpiece 102A with a vertical surface 104A is rotated in a direction indicated by the arrow 108A, but could be rotated in the opposite direction. An ion beam sputtering target 112A provides a material flux 115 with an angle of ejection approximately equal to the angle of incidence of the ion beam 117 arriving from the ion beam source 119 on the target. The walls of the processing chamber and associated apparatus are not illustrated in this figure for purposes of clarity. The material flux has a shape and cross-section dependant on the impinging ion beam and other factors. Typically the material flux is essentially conical with a circular or elliptical cross-section.

A sputtering mask 118A is placed in front of the material flux 115 to block a center portion 114A of the material flux and admit a deposition portion of the material flux 116A, a portion of which is deposited on the vertical surface. The sputtering mask includes a center mask 118B and a side mask 118C that form an aperture 118D that the admits the deposition portion of the material flux and blocks a further side portion of the flux. FIG. 1C shows a second side mask 118E forming a second aperture 118F, allowing thin films to be formed on opposite-facing vertical surfaces in a single processing step.

III. An Exemplary Device

Figure 2:
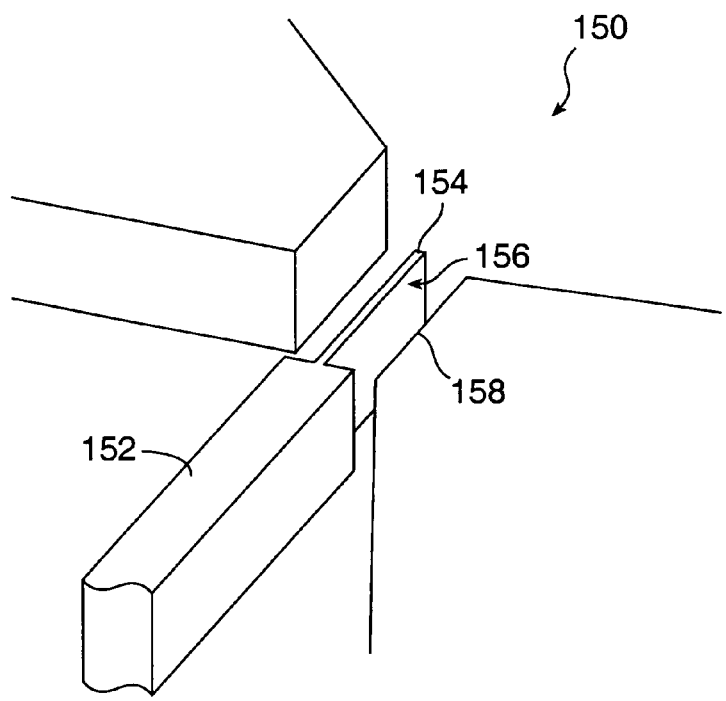

FIG. 2 is a simplified perspective view of a portion of a MEMS device 150 on which to practice the present invention. The MEMS device includes a switch with a movable center beam 152 that has a mounting portion 154 on which it is desired to form a mirror on the vertical surface 156. The mounting portion is about 1 micron thick and about 70–75 microns high, thus it has an aspect ratio of about 70–75. The mounting portion extends about 25–30 microns from the center beam. The setback from the vertical surface to a proximate edge 158 is about 200–250 microns.

Using a process according to an embodiment of the present invention, a smooth layer of gold about 1,000 Angstroms thick was formed on the vertical surface of the mounting portion. No device masking was used in the sputtering process, and a second mirror was formed on a second vertical surface 160 during the same sputtering process step utilizing the two-gap mask configuration shown in FIG. 1B. The thin film gold layer was formed with essentially no material build-up and flaking near the major surface of the substrate. Such build-up and flaking can cause the surface of the mirror to be rough, increasing the reflection loss of the mirror and degrading other performance characteristics of the mirror, such as scattering.

IV. An Exemplary Process

Figure 3:
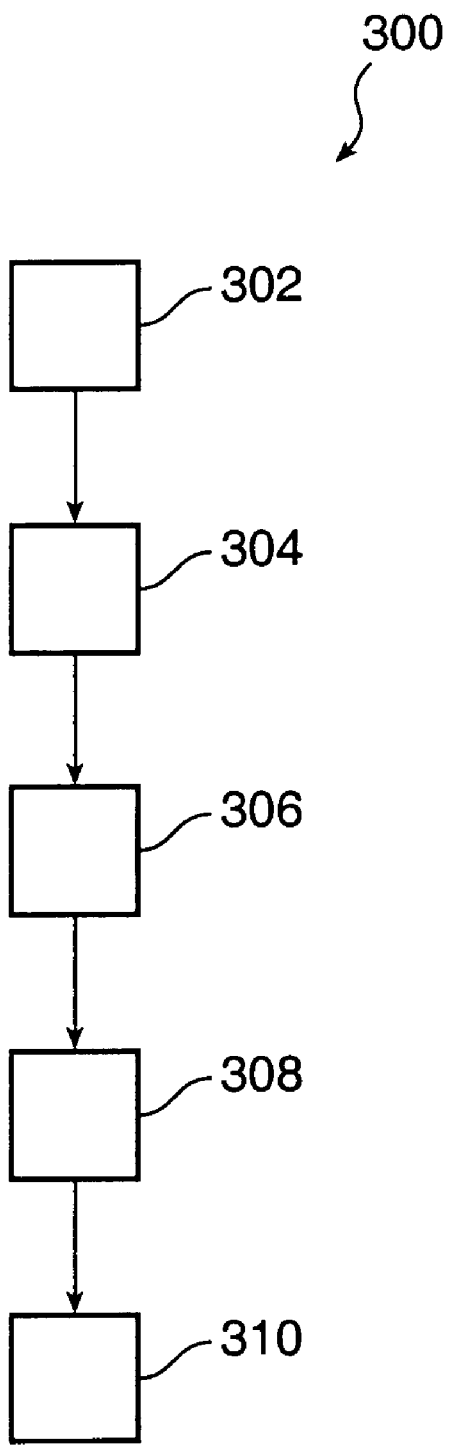
FIG. 3 is a simplified flow chart of a process according to an embodiment of the present invention.

FIG. 3 is a simplified flow chart of a process 300 according to an embodiment of the present invention. A device with a vertical surface is provided in a processing chamber (step 302). Selected process conditions are established according to the intended process (step 304). A material flux including a center flux and a side flux is developed from a material source (step 306). The center flux is blocked with a mask that admits the side flux into the processing chamber (step 308). The device is rotated past the material source until a layer of material having a desired thickness is formed from the side flux (step 310).

In an exemplary process, chamber pressure is established at $10^{-4}$ Torr to compensate for the longer distance (20–30 cm) from the target to the vertical surface when the vertical surface is essentially normal to the side flux. The rotational speed of the device is about 100 rpm and the time to deposit the desired 1000 Angstrom layer is about 3 minutes. The rotation of the device past the target assists with layer uniformity, and lower speed (i.e. higher deposition rates—holding other parameters equal) could be used for devices with lower aspect ratios. The chosen target is a gold target because the resulting mirror provides high reflectivity (>97%) over the wavelengths of light typically carried on an optical fiber network. Other materials could be used, such as copper, silver, aluminum, and platinum for the same of other applications. Similarly, a deposition system with two or more material sources could be used, allowing the deposition of an alternating stack of materials, such as to form a reflective dielectric mirror or bandpass filter.

While the description above provides a full and complete disclosure of the preferred embodiments of the present invention, various modifications, alternatives, and equivalents will be obvious to those of skill in the art. For example, although an embodiment has been described depositing a mirror on a thin vertical element of a MEMS device, other types of coatings could be deposited, and other the vertical element need not be thin. Similarly, the invention may be applied to vertical surfaces with or without a particular set-back from proximate structures. Accordingly, the scope of the invention is limited solely by the following claims.

What is claimed is:

1. A method of depositing a thin film layer on a vertical surface of a device in a processing chamber, the method comprising:

providing the device with the vertical surface to the processing chamber;

establishing selected process conditions;

developing a material flux from a material source, the material flux having a center flux and a side flux;

blocking the center flux with a mask and concurrently depositing a portion of the side flux onto the vertical surface of the device while rotating the device about a center axis past the material source until a layer of material having a desired thickness is formed on the vertical surface, wherein the vertical surface lies essentially along a radius from the center axis.

2. The method of claim 1 wherein the device has a second vertical surface lying essentially along a second radius from the center axis and facing opposite to the vertical surface and the material flux includes a second side flux, the method further comprising concurrently depositing a second thin film layer on the second vertical surface.

3. The method of claim 1 wherein the establishing selected process conditions step includes establishing a vacuum of about $10^{-4}$ Torr inside the processing chamber and the developing a material flux step includes a sputtering step.

4. The method of claim 3 wherein the material source is a gold source and the desired thickness is about 1000 Angstroms.

5. A method of depositing a thin film layer on a first vertical surface and a second vertical surface of a device in a processing chamber, the method comprising:

providing the device to the processing chamber, the device having a first vertical surface lying essentially along a first radius from a center axis and a second vertical surface lying essentially along a second radius from the center axis;

establishing a chamber pressure of about $10^{-4}$ Torr;

developing a material flux from a metallic sputtering source, the material flux having a center flux, a first side flux, and a second side flux;

blocking the center flux with a mask;

depositing a portion of the first side flux onto the first vertical surface of the device and concurrently depositing a portion of the second side flux onto the second vertical surface of the device while rotating the device about the center axis past the material source.

6. A method of concurrently depositing two thin film layers on vertical surfaces of a device in a processing chamber, the method comprising:

providing the device with a first vertical surface lying essentially along a first radius from a center axis and a second vertical surface lying essentially along a second radius from the center axis, the second vertical surface facing opposite to the first vertical surface, to the processing chamber;

establishing a chamber pressure of about $10^{-4}$ Torr;

sputtering a material flux from a material source, the material flux having a center flux and a first side flux, and a second side flux;

blocking the center flux with a mask and concurrently depositing a portion of the first side flux onto the first vertical surface of the device and concurrently depositing a portion of the second side flux onto the second vertical surface of the device while rotating the device about the center axis past the material source until a first layer of material is formed on the first vertical surface and a second layer of material is formed on the second vertical surface.

7. An apparatus for forming thin film layers on high-aspect vertical surfaces of devices, the apparatus comprising:

a material source capable of providing a material flux coupled to a processing chamber, the processing chamber being coupled to a vacuum system configured to establish and maintain a selected pressure within the processing chamber;

a drum within the processing chamber, the drum being configured to mount a device with a vertical surface lying essentially along a radius of a center axis and to rotate the device about the center axis past the material surface; and a mask disposed between the material source and the drum, the mask being disposed to block a center flux portion of the material flux and to admit a side flux portion of the material flux.

8. The apparatus of claim 7 wherein the material source is a metal sputtering target.

9. The apparatus of claim 7 further comprising a center mask portion of the mask and a side mask portion of the mask, the center mask portion and the side mask portion forming an aperture to admit a deposition portion of the side flux portion of the material flux.

10. The apparatus of claim 9 wherein the side mask portion is formed by an edge of the material source.

11. The apparatus of claim 9 wherein the aperture is about 25 mm.

12. The apparatus of claim 7 wherein the drum is capable of rotating at a speed of about 100 rpm.

* * * * *